(12) United States Patent
Chiu et al.

(10) Patent No.: US 11,987,431 B2
(45) Date of Patent: May 21, 2024

(54) TOP-OPENING SUBSTRATE CARRIER (71) Applicant: GUDENG PRECISION INDUSTRIAL CO., LTD., New Taipei (TW)

(72) Inventors: Ming-Chien Chiu, New Taipei (TW); Yung-Chin Pan, New Taipei (TW); Cheng-En Chung, New Taipei (TW); Chih-Ming Lin, New Taipei (TW); Po-Ting Lee, New Taipei (TW); Wei-Chien Liu, New Taipei (TW); Tzu-Ning Huang, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 18/126,493

(22) Filed: Mar. 27, 2023

(65) Prior Publication Data

US 2024/0034525 A1 Feb. 1, 2024

Related U.S. Application Data (60) Provisional application No. 63/392,858, filed on Jul. 27, 2022.

(51) Int. Cl.
*B65D 55/02* (2006.01)
*B65D 43/02* (2006.01)
*B65D 85/00* (2006.01)

(52) U.S. Cl.
CPC ......... *B65D 55/02* (2013.01); *B65D 43/0202* (2013.01); *B65D 85/54* (2013.01); *B65D 2255/20* (2013.01); *B65D 2543/00203* (2013.01)

(58) Field of Classification Search
CPC .............. B65D 2255/00; B65D 2255/20; B65D 43/02; B65D 43/0202; B65D 43/00; B65D 55/02; B65D 85/54
USPC .................................................. 206/1.5
See application file for complete search history.

(56) References Cited

U.S. PATENT DOCUMENTS

| 8,794,444 | B2 * | 8/2014 | Sheng | ............... H01L 21/67379 206/454 |
|---|---|---|---|---|
| 2002/0020650 | A1 * | 2/2002 | Fujimori | ........... H01L 21/67369 206/454 |
| 2011/0139675 | A1 * | 6/2011 | Ku | ..................... H01L 21/67369 206/711 |
| 2015/0348810 | A1 * | 12/2015 | Burns | ............... H01L 21/67376 141/8 |

(Continued)

*Primary Examiner* — Javier A Pagan (57) ABSTRACT

A top-opening substrate carrier comprises a container body, a door member and at least one latching mechanism. The latching mechanism includes a rotary drive member, a first driven cam, a second driven cam, a first connecting rod, a second connecting rod, two longitudinal latching arms and two lateral latching arms. The first driven cam and the second driven cam are disposed at two sides of the rotary drive member. When the rotary drive member is rotated by force, it links and activates the first connecting rod and the second connecting rod to synchronously drive the first driven cam and the second driven cam to rotate, thereby driving the two longitudinal latching arms and the two lateral latching arms to project towards locking holes of the container body and locked, or retract from the locking holes of the container body and unlocked.

10 Claims, 8 Drawing Sheets

(56) References Cited

U.S. PATENT DOCUMENTS

| | | | |
|---|---|---|---|
| 2015/0357218 A1* | 12/2015 | Lin | H01L 21/67393 |
| | | | 137/574 |
| 2017/0049284 A1* | 2/2017 | Wang | A47L 9/02 |
| 2017/0213752 A1* | 7/2017 | Ogawa | H01L 21/67386 |

\* cited by examiner

TOP-OPENING SUBSTRATE CARRIER

CROSS-REFERENCE TO RELATED APPLICATION

This non-provisional application claims priority under 35 U.S.C. § 119(e) on U.S. provisional Patent Application No. 63/392,858 filed on Jul. 27, 2022, the entire contents of which are hereby incorporated by reference.

BACKGROUND OF THE INVENTION

1. Field of the Invention

The present disclosure relates to a carrier, and in particular to a top-opening substrate carrier.

2. Description of the Related Art

Industrial substrates, such as printed circuit boards and other plates, are widely present in various fields of industry, especially in the field of semiconductors. The substrate may be an initial substrate ready for the process, a substrate that is carrying out the process in progress, or a finished substrate that has already completed the process. Regardless of the state of the substrate, it needs to be loaded and transported by a substrate container to protect the substrate from collision of external forces and isolate the substrate from the environmental pollution.

A substrate container is preferable to be able to stably load multiple substrates, so that the automated instrument can take out multiple stacked substrates at once, or gradually take out each the substrate.

BRIEF SUMMARY OF THE INVENTION

Therefore, in order to solve various problems of the traditional substrate container, the present disclosure proposes a top-opening substrate carrier.

To achieve the above objective and other objectives, the disclosure provides a top-opening substrate carrier, comprising a container body, having an accommodating space and an upper opening communicated to the accommodating space, the container body is provided with a plurality of locking holes; a door member, provided in the upper opening, the door member has a latching space; and at least one latching mechanism, provided in the latching space, the latching mechanism includes a rotary drive member, a first driven cam, a second driven cam, a first connecting rod, a second connecting rod, two longitudinal latching arms and two lateral latching arms, the first driven cam and the second driven cam are respectively disposed at two opposite sides of the rotary drive member, the first connecting rod is at least connected to the first driven cam and the rotary drive member, and the second connecting rod is at least connected to the second driven cam and the rotary drive member; wherein the rotary drive member is rotated by force, and links and activates the first connecting rod and the second connecting rod to synchronously drive the first driven cam and the second driven cam to rotate, thereby driving the two longitudinal latching arms and the two lateral latching arms to project towards the plurality of locking holes and locked, or driving the two longitudinal latching arms and the two lateral latching arms to retract from the plurality of locking holes and unlocked.

In one embodiment of the disclosure, the rotary drive member is a cam, the first connecting rod is connected to a first butting portion on the rotary drive member and the first driven cam, the second connecting rod is connected to a second butting portion on the rotary drive member and the second driven cam.

In one embodiment of the disclosure, the first connecting rod is further extended to the second driven cam, the second connecting rod is further extended to the first driven cam, the first connecting rod and the second connecting rod are parallel to each other.

In one embodiment of the disclosure, one end of one of the longitudinal latching arms and one end of one of the lateral latching arms are slidably connected to the first driven cam, and may respectively activate to project or retract from the first driven cam toward the plurality of locking holes, one end of the other one of the longitudinal latching arms and one end of the other one of the lateral latching arms are slidably connected to the second driven cam, and may respectively activate to project or retract from the second driven cam toward the plurality of locking holes.

In one embodiment of the disclosure, the rotary drive member is a linkage member, the first connecting rod and the second connecting rod are respectively connected to the first driven cam and the second driven cam, and the linkage member is connected to the first connecting rod and the second connecting rod.

In one embodiment of the disclosure, an extension direction of the longitudinal latching arm is perpendicular to an extension direction of the lateral latching arm.

In one embodiment of the disclosure, the number of the latching mechanism is two, the two latching mechanisms are mirror-symmetrically provided in the latching space with each other.

In one embodiment of the disclosure, the first driven cam and the second driven cam are respectively provided with two guide grooves, the two longitudinal latching arms and the two lateral latching arms are respectively slidably disposed in the guide groove with a guide post.

In one embodiment of the disclosure, the door member includes a door body and a door cover, the door cover covers the door body to define the latching space.

In one embodiment of the disclosure, the longitudinal latching arm and the lateral latching arm respectively further include at least one elastic member, and one end of the elastic member is abutted against a surface of the door body.

Accordingly, the top-opening substrate carrier of the present disclosure mainly has an opening facing upwards, which can not only adjust the height of the accommodating space according to the number of substrates, but also simplify the support components of the carrier; in addition, a single latching mechanism can be simply operated to lock or unlock the door member in multiple directions. Compared with the prior art, the latching mechanism of the top-opening substrate carrier of the present disclosure has the advantages of saving labor and saving time for locking, convenience and reducing the number of parts.

DETAILED DESCRIPTION OF THE INVENTION

Figure 1:
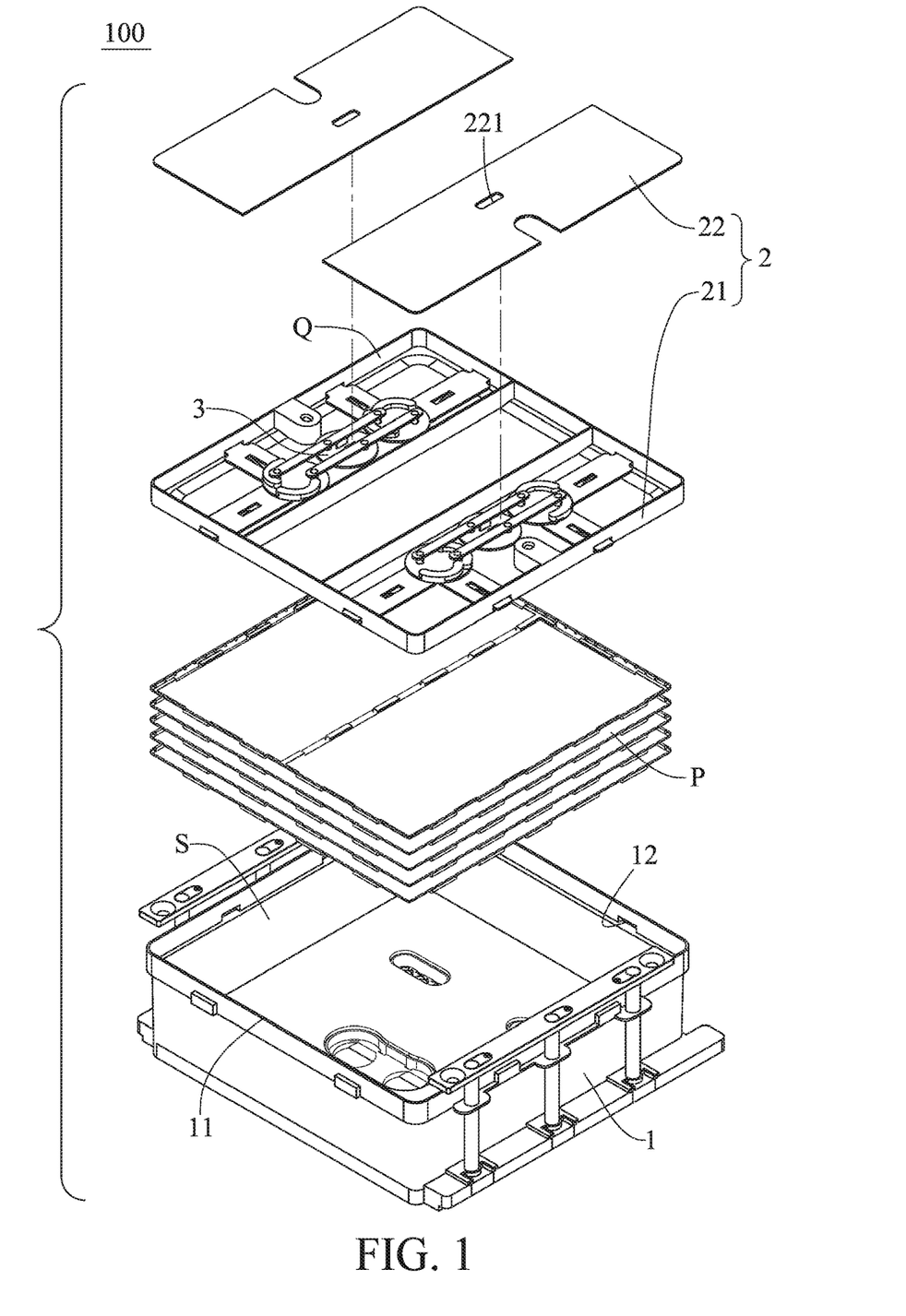
FIG. 1 is an exploded view of a top-opening substrate carrier according to a first embodiment of the present disclosure.

To facilitate understanding of the present disclosure, embodiments together with the attached drawings for the detailed description of the present disclosure are provided. One skilled in the art can understand the object, characteristics and effects of this present disclosure by the content described in the specification. It should be noted that various possible modifications and alterations to the details of the specification could be carried out by implementing or applying other different embodiments based on different views and applications without departing from the spirit of the present application. The related technical contents of the disclosure will be described in detail by the embodiments. However, the disclosed contents should not be considered to limit the scope of the disclosure. The description is provided as follows:

As shown in FIG. 1, an embodiment of the present disclosure provides a top-opening substrate carrier 100, comprising a container body 1, a door member 2 and at least one latching mechanism 3.

The container body 1 has an accommodating space S and an upper opening 11 communicated to the accommodating space S, an opening direction of the upper opening 11 is facing upwards, and the container body 1 is further provided with a plurality of locking holes 12 for locking the latching mechanisms 3 at a position adjacent to the upper opening 11. The position, number and size of the locking hole 12 can be adjusted according to the design of the latching mechanism 3. Preferably, the locking holes 12 surround a perimeter of the upper opening 11 to provide locking positions in multiple directions. The accommodating space S is used to accommodate a plurality of substrates P, so that the plurality of substrates P can be closely stacked in the accommodating space S from the upper opening 11. Preferably, each the substrate P is placed on one tray, and each the tray is stacked with each other, thereby separating each the substrate P. When stacking or taking out the substrates P, automated instruments (e.g., robotic arms) clamp/vacuum pick a stack of trays directly above the opening, or take out each the tray individually.

The door member 2 is provided in the upper opening 11, and the door member 2 has a latching space Q. The door member 2 is covered on an upper opening 11 to close the accommodating space S, and the door member 2 may be removed relative to the container body 1 to take out or place the substrate P. In the present embodiment, the door member 2 includes a door body 21 and a door cover 22, the door cover 22 covers the door body 21 to define the latching space Q. However, the present disclosure is not limited thereto, the door member 2 may have other forms of structure to produce a latching space Q adjacent to the upper opening 11.

Figure 2:
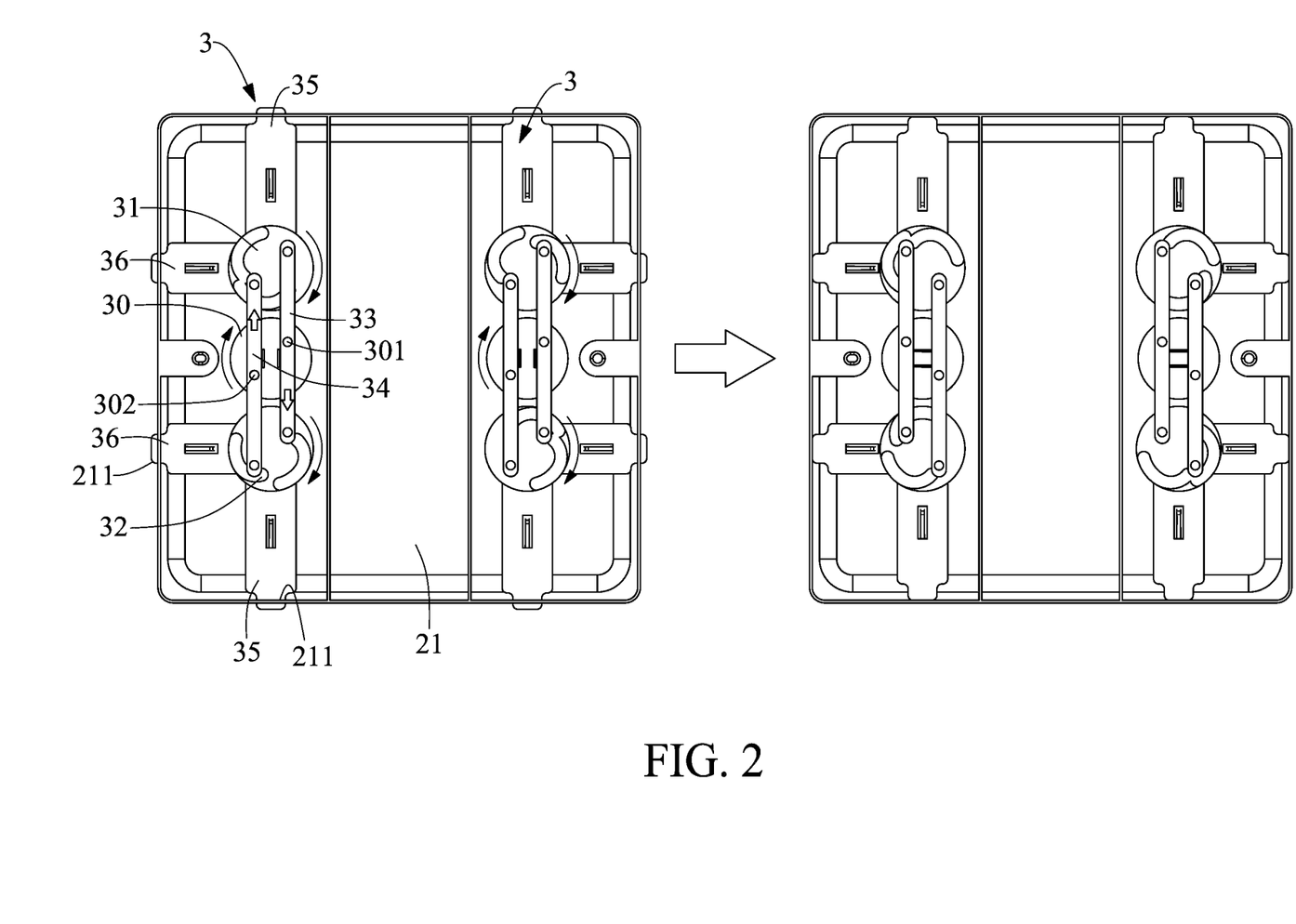
FIG. 2 is a schematic view of a latching mechanism converting from a locked state to an unlocked state according to the first embodiment of the present disclosure.
Figure 3:
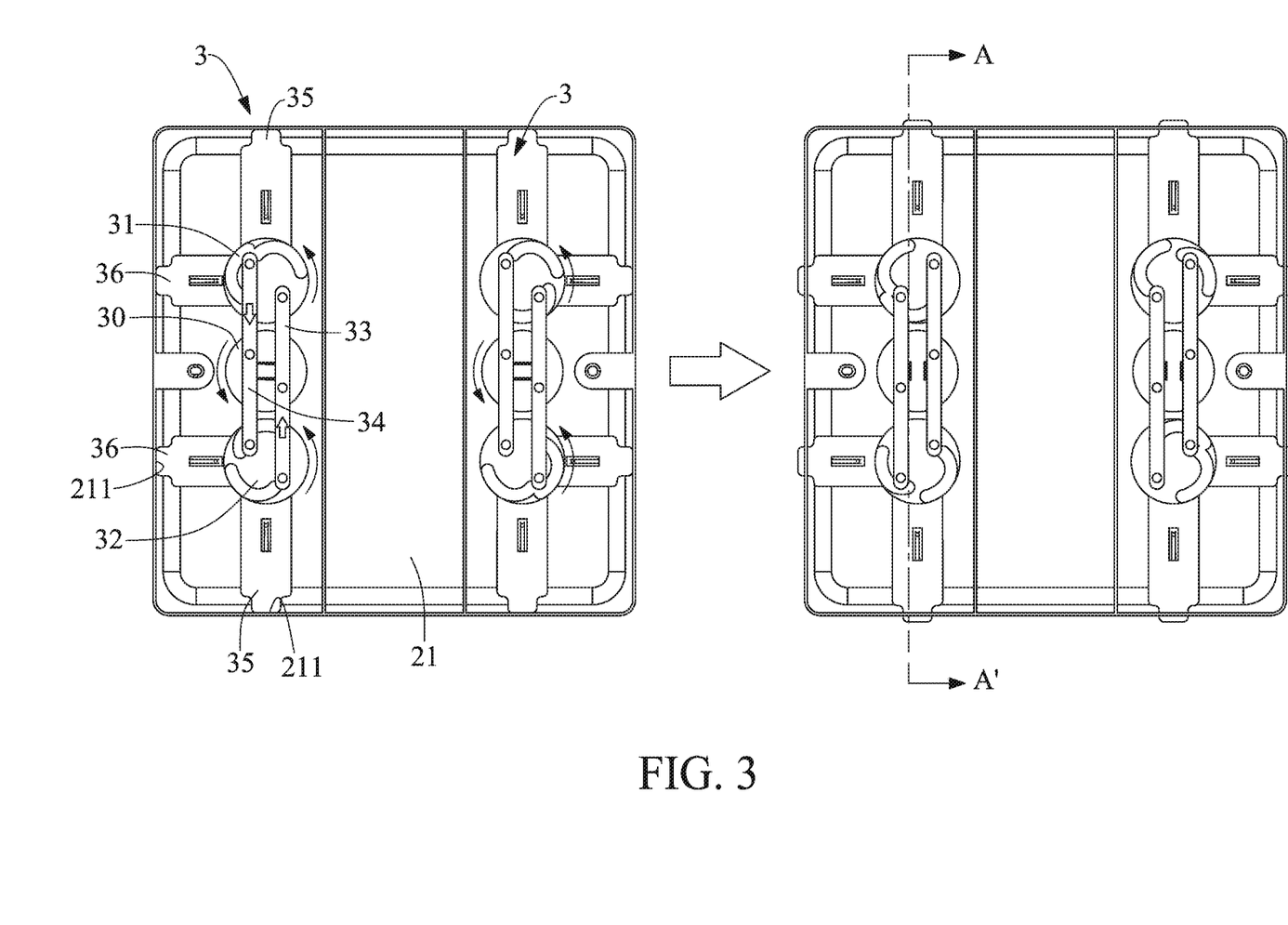
FIG. 3 is a schematic view of the latching mechanism converting from an unlocked state to a locked state according to the first embodiment of the present disclosure.

As shown in FIGS. 1 to 3, the latching mechanism 3 is provided in the latching space Q. The latching mechanism 3 includes a rotary drive member 30, a first driven cam 31, a second driven cam 32, a first connecting rod 33, a second connecting rod 34, two longitudinal latching arms 35 and two lateral latching arms 36. The first driven cam 31 and the second driven cam 32 are respectively disposed at two opposite sides of the rotary drive member 30, the first connecting rod 33 is at least connected to the first driven cam 31 and the rotary drive member 30, and the second connecting rod 34 is at least connected to the second driven cam 32 and the rotary drive member 30.

Next, it will be explained how to use the rotation of the rotary drive member 30 to drive the latching mechanism 3 to lock and unlock.

The rotary drive member 30 may be driven by human or automated machinery to rotate. When the latching mechanism 3 is disposed in the latching space Q and the upper part is covered by the door cover 22, a key may be inserted from a door hole 221 into a keyhole of the rotary drive member 30 to drive the rotary drive member 30 to carry out clockwise or counterclockwise rotation.

As shown in FIG. 2, the rotary drive member 30 is rotated towards a first direction by an external force (e.g., clockwise rotation), and links and activates the first connecting rod 33 and the second connecting rod 34 to synchronously drive the first driven cam 31 and the second driven cam 32 to rotate clockwise, thereby driving the two longitudinal latching arms 35 and the two lateral latching arms 36 to retract from the plurality of locking holes 12, an operating hole 211 and unlocked.

Conversely, as shown in FIG. 3, when the rotary drive member 30 is rotated towards a second direction by an external force (e.g., counterclockwise rotation), and links and activates the first connecting rod 33 and the second connecting rod 34 to synchronously drive the first driven cam 31 and the second driven cam 32 to rotate counterclockwise, thereby driving the two longitudinal latching arms 35 and the two lateral latching arms 36 to project towards the plurality of locking holes 12 (and pass through the operating hole 211 at the edge of the door body 21) and locked. The method of the rotary drive member 30 "rotating clockwise as unlocking, rotating counterclockwise as locking" is only one of embodiments, and the present disclosure is not limited to a specific direction of rotation as an unlocked state or a locked state.

The following will illustrate how to use the rotation of the first driven cam 31 and the second driven cam 32 to drive the longitudinal latching arm 35 and the lateral latching arm 36 to project or retract. The structure and actuation mode of the longitudinal latching arm 35 and the lateral latching arm 36 driven by the first driven cam 31 and the second driven cam 32 are the same, referring to FIG. 4, taking the first driven cam 31 driving a set of longitudinal latching arm 35 and lateral latching arm 36 as an example herein, the structure and actuation mode of the second driven cam 32 will not be repeated.

Figure 4:
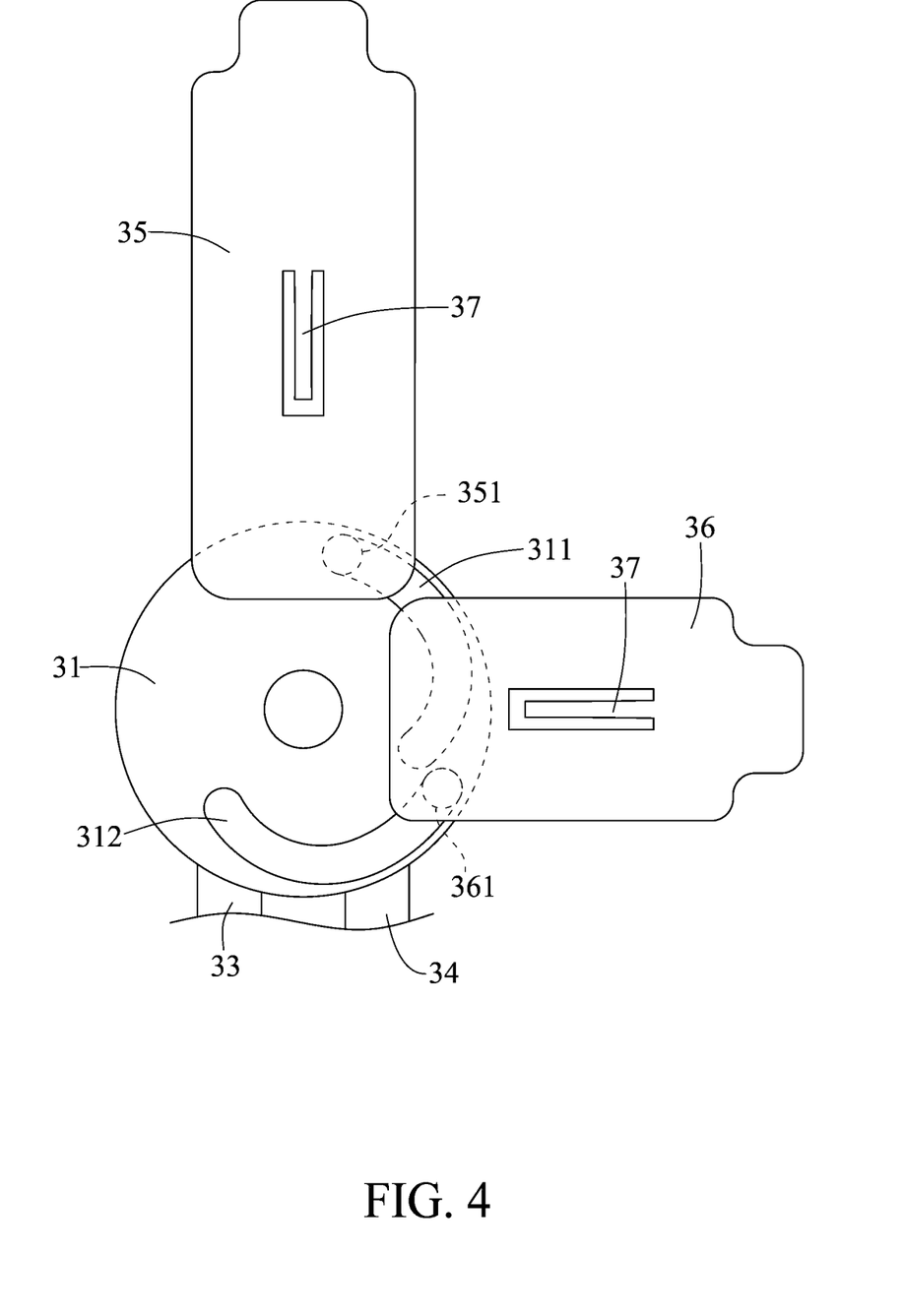
FIG. 4 is a schematic partially enlarged view of the latching mechanism according to the first embodiment of the present disclosure.

The first driven cam 31 is provided with two guide grooves 311, 312, the two guide grooves 311, 312 are roughly arc-shaped, and two endpoints of each of the guide grooves 311, 312 are not the same distance from a rotating center of the first driven cam 31. One end of the longitudinal latching arm 35 is slidably connected to the guide groove 311 of the first driven cam 31; one end of the lateral latching arm 36 is slidably connected to the guide groove 312 of the first driven cam 31. When the first driven cam 31 is driven by the first connecting rod 33 and rotates clockwise or counterclockwise, the longitudinal latching arm 35 and the lateral latching arm 36 respectively slide relative to each other in the guide grooves 311 and 312, so the distances between connecting ends of the longitudinal latching arm 35 and the lateral latching arm 36 relative to the rotating center of the first driven cam 31 will also change. When the longitudinal latching arm 35 and the lateral latching arm 36 are far from the rotating center of the first driven cam 31, the other end (reversing to the connecting end) of each the longitudinal latching arm 35 and the lateral latching arm 36 is pushed to each the locking hole 12 and is in a locked state; when the longitudinal latching arm 35 and the lateral latching arm 36 are relatively close to the rotating center of the first driven cam 31, the other end of each the longitudinal latching arm 35 and the lateral latching arm 36 is retracted from each the locking hole 12 and is in an unlocked state.

That is to say, the latching mechanism 3 of the present embodiment uses the unequal distance change of the two guide grooves 311, 312 relative to the rotating center to change the state of projection or retraction of the longitudinal latching arm 35 and the lateral latching arm 36. In addition, the design of the longitudinal latching arm 35 and the lateral latching arm 36 as well as the first driven cam 31 and the second driven cam 32 may also be changed, so that the longitudinal latching arm 35 and the lateral latching arm 36 may be projected or retracted by the rotation of the first driven cam 31 and the second driven cam 32, that is, it is not limited to the form of the guide groove. Any mechanism capable of driving the longitudinal latching arm 35 and the lateral latching arm 36 to project or retract by rotation is covered by the present disclosure.

In summary, in the top-opening substrate carrier 100 of the present disclosure, as long as a single latching mechanism 3 is simply operated, it can lock or unlock the door member 2 in multiple directions, which are an upper, lower and side direction on the drawings of FIGS. 2 and 3. At present, large substrates on the market require a larger substrate containers for bearing use, so a stable latching mechanism design is required, and thus the present disclosure may further design two sets of mirror-symmetrical latching mechanisms 3 in response to the needs, they are also disposed in the latching space Q to firmly lock four directions and multiple positions on the plane at the same time. The present disclosure does not limit the number of the latching mechanism 3 used, and may also design more latching mechanisms 3 in the door member. Compared with the prior art, the latching mechanism 3 of the top-opening substrate carrier 100 of the present disclosure has the advantages of saving labor and saving time for locking, convenience and reducing the number of parts.

Further, in a first embodiment, as shown in FIGS. 2 and 3, the rotary drive member 30 is a cam, the first connecting rod 33 is connected to a first butting portion 301 (the butting portion may be a bump) on the rotary drive member 30 and the first driven cam 31, the second connecting rod 34 is connected to a second butting portion 302 (the butting portion may be a bump) on the rotary drive member 30 and the second driven cam 32. Among them, the first connecting rod 33 is further extended to the second driven cam 32, the second connecting rod 34 is further extended to the first driven cam 31, the first connecting rod 33 and the second connecting rod 34 are parallel to each other. This is designed to rotate each cam firmly.

Figure 6:
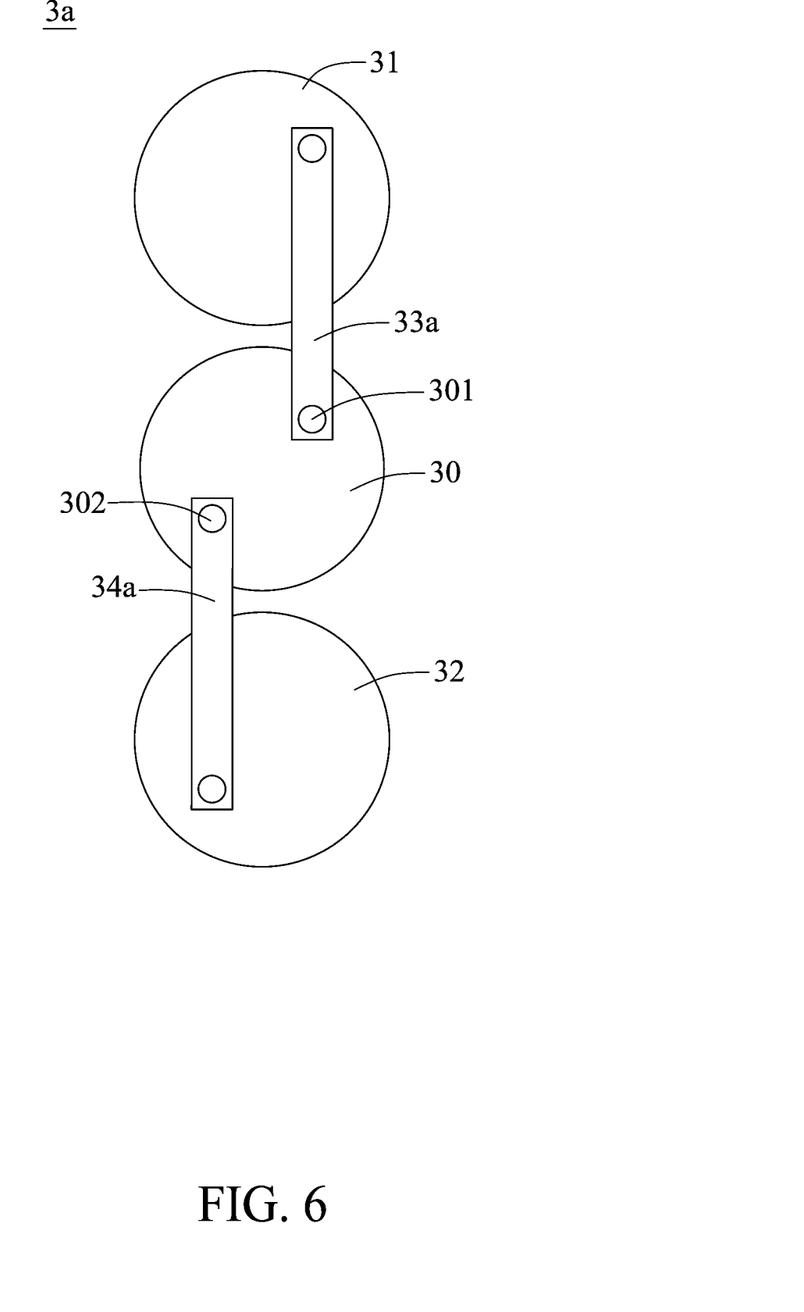
FIG. 6 is a schematic view of a latching mechanism according to a second embodiment of the present disclosure, wherein the longitudinal latching arm and the lateral latching arm are omitted.

However, "the first connecting rod 33 (or the second connecting rod 34) simultaneously linking the rotary drive member 30 as well as the first driven cam 31 and the second driven cam 32 at both sides as one" is not a necessary condition of the present disclosure, the first connecting rod 33 or the second connecting rod 34 may also be deconstructed into a plurality of portions so that the rotary drive member 30 respectively drives the first driven cam 31 and the second driven cam 32. For example, as shown in FIG. 6, the rotary drive member 30 of the latching mechanism 3a of a second embodiment of the present disclosure is a cam, the first connecting rod 33a is only connected to a first butting portion 301 on the rotary drive member 30 and the first driven cam 31, and the second connecting rod 34a is only connected to a second butting portion 302 on the rotary drive member 30 and the second driven cam 32.

Figure 7:
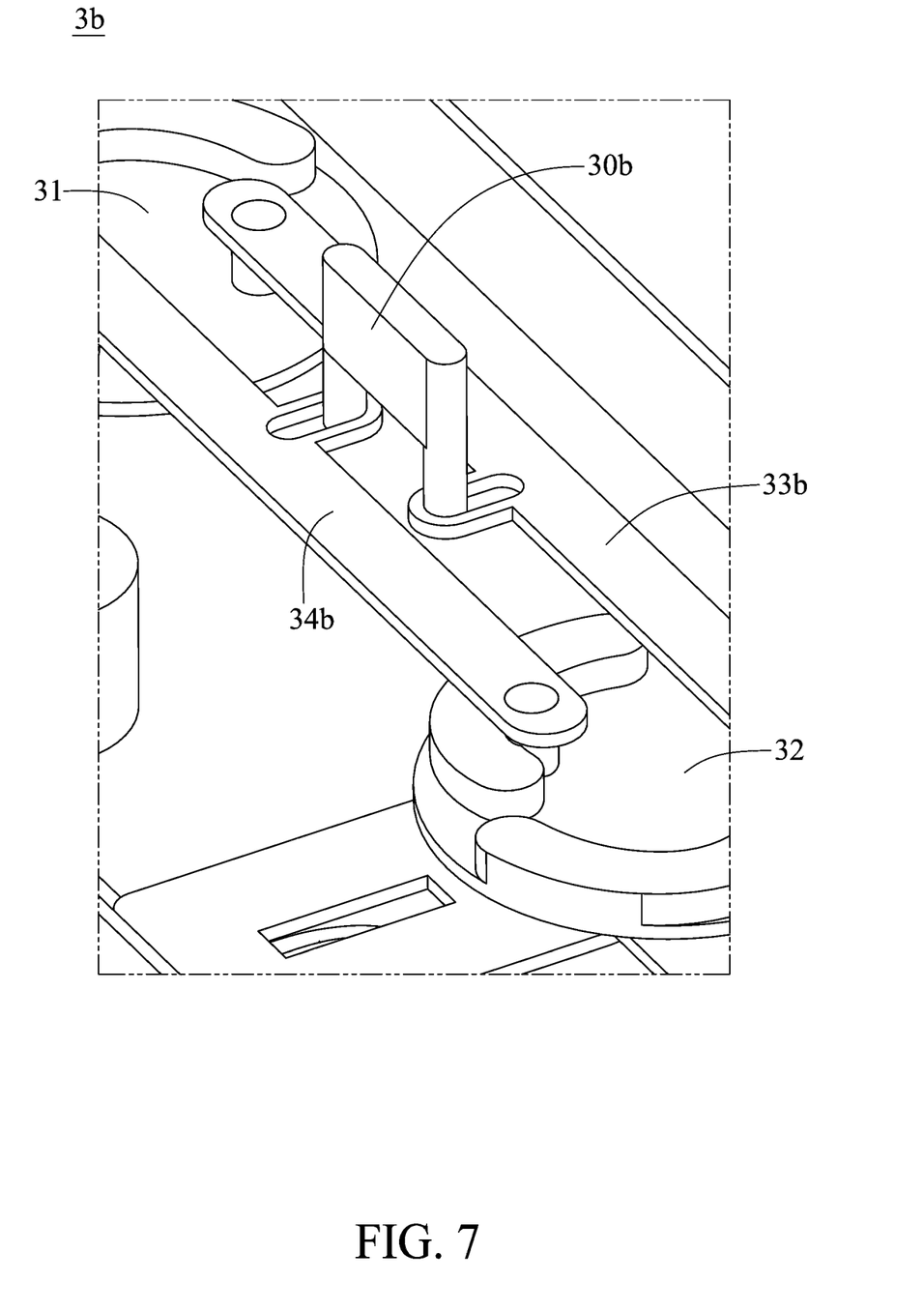
FIG. 7 is a schematic partially perspective view of a latching mechanism according to a third embodiment of the present disclosure.
Figure 8:
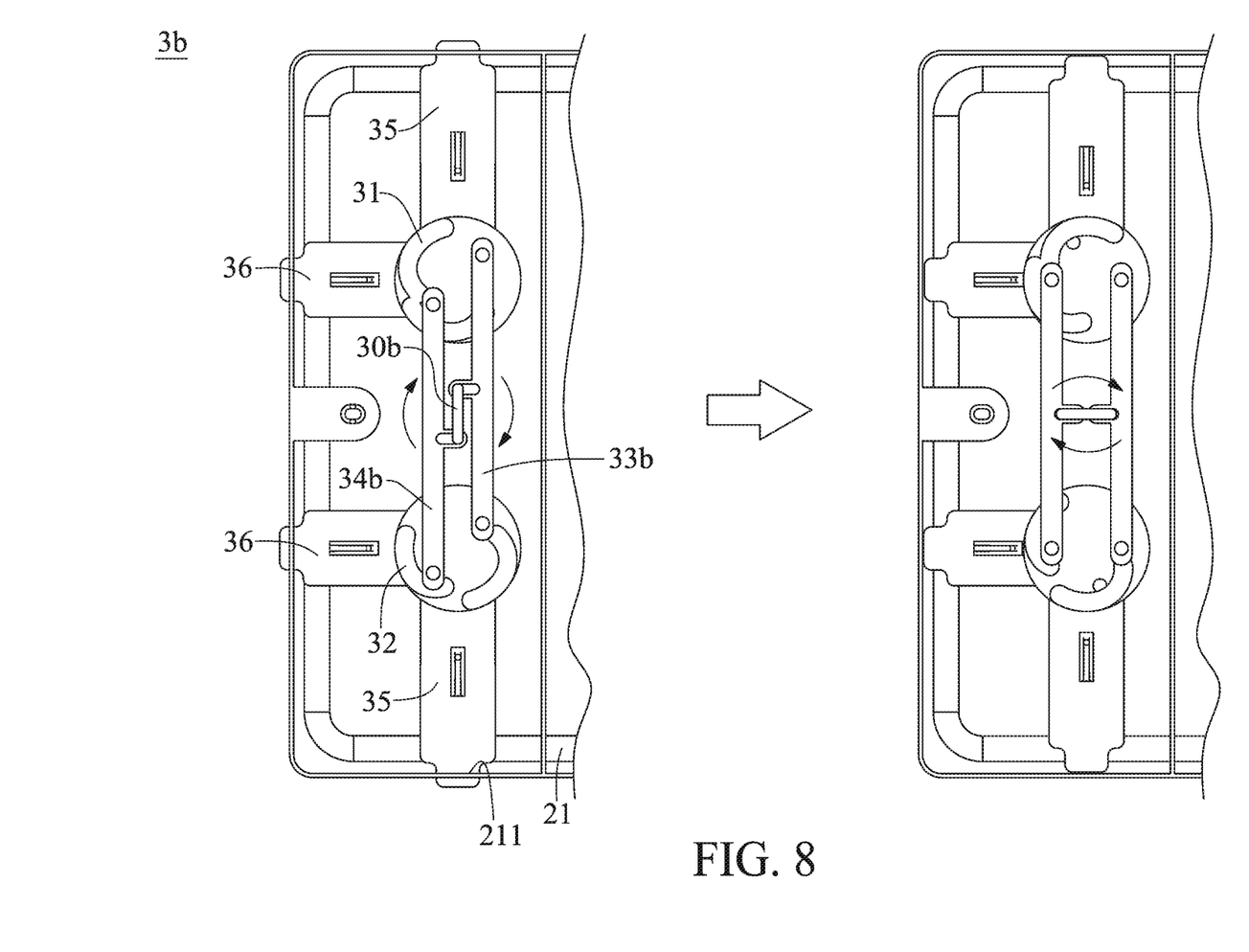
FIG. 8 is a schematic view of the latching mechanism of FIG. 7 converting from a locked state to an unlocked state.

Further, without changing the principle of drive technology, in a third embodiment of the present disclosure, as shown in FIGS. 7 and 8, the rotary drive member 30b is a linkage member, the first connecting rod 33b and the second connecting rod 34b are respectively connected to the first driven cam 31 and the second driven cam 32, and the rotary drive member 30b in a form of the linkage member is connected to the first connecting rod 33b and the second connecting rod 34b.

As shown by the arrow in FIG. 8, the rotation direction of the rotary drive member 30b in the form of the linkage member, such as 90 degrees clockwise rotation, the rotary drive member 30b may simultaneously drive the first driven cam 31 and the second driven cam 32 at both sides at the same time, so that the two longitudinal latching arms 35 and the two lateral latching arms 36 are retracted from locking positions and unlocked. Similarly, if the rotary drive member 30b is rotated in reverse again, such as 90 degrees counterclockwise rotation, the latching mechanism can be returned to the locked state.

The rotary drive member 30b in the form of the linkage member may be used as part of the latching mechanism 3, which is normally disposed on the first connecting rod 33b and the second connecting rod 34b, and rotated by a robotic arm. In other examples, the rotary drive member 30b in the form of the linkage member is not normally disposed on the first connecting rod 33b and the second connecting rod 34b. On the contrary, the rotary drive member 30b serves as a key. When the latching mechanism 3 needs to be locked/unlocked, the rotary drive member 30b in the form of the linkage member is connected to the first connecting rod 33b and the second connecting rod 34b by means of instrument or manual to drive the first driven cam 31 and the second driven cam 32.

Compared with the rotary drive member 30 of the first embodiment, the rotation stroke of the rotary drive member 30b of the third embodiment is small, that is, the projection and retraction of the longitudinal latching arm 35 and the lateral latching arm 36 can be controlled by a relatively small rotation amplitude. The amount of rotation stroke can be changed accordingly by adjusting of the aforementioned guide groove or equivalent structures of the guide groove.

Further, in an embodiment of the present disclosure, an extension direction of the longitudinal latching arm 35 is perpendicular to an extension direction of the lateral latching arm 36 to match the rectangular upper opening 11. However, the present disclosure is not limited thereto, in other embodiments, the extension direction of the longitudinal latching arm 35 may not be perpendicular to the extension direction of the lateral latching arm 36, for example, the upper opening 11 is non-rectangular.

Further, as shown in FIG. 4, in the first embodiment of the present disclosure, the first driven cam 31 is provided with two guide grooves 311, 312, one of the longitudinal latching arms 35 and one of the lateral latching arms 36 are respectively slidably disposed in the two guide grooves 311, 312 with guide posts 351, 361. Similarly, the second driven cam 32 is also provided with two guide grooves (not shown), the other longitudinal latching arm 35 and the other lateral latching arm 36 are respectively slidably disposed in two guide grooves with guide posts 351, 361. The design of the guide posts 351, 361 can be cooperated with the guide grooves 311, 312 and engaged in the guide grooves 311, 312, so that the respective connecting ends of the longitudinal latching arm 35 and the lateral latching arm 36 can slide in the guide grooves 311, 312 without falling apart.

Figure 5:
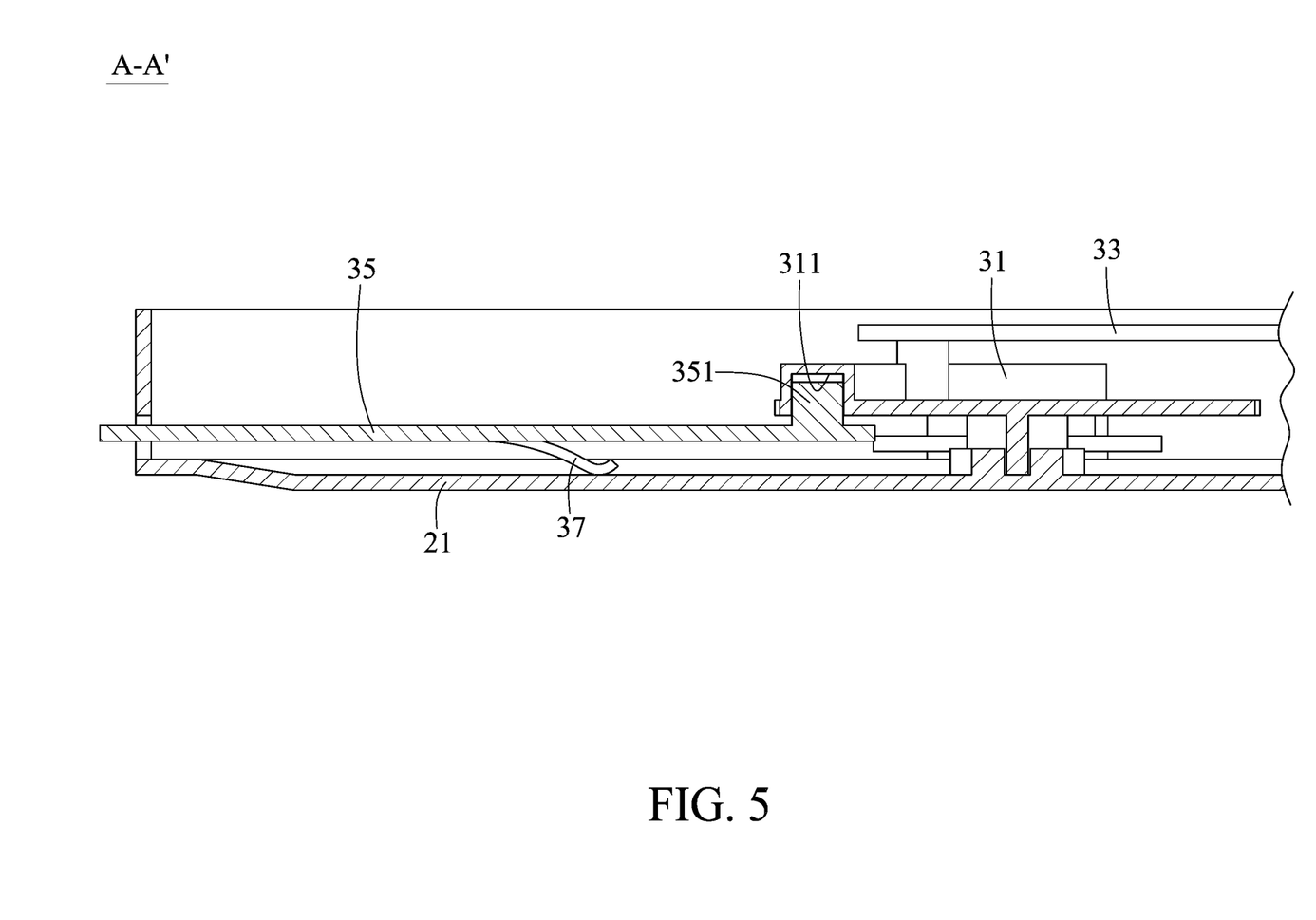
FIG. 5 is a schematic partially sectional view according to segment A-A' of FIG. 3.

Further, as shown in FIG. 5, in the first embodiment of the present disclosure, the longitudinal latching arm 35 and the lateral latching arm 36 respectively further include at least one elastic member 37, and one end of the elastic member 37 is abutted against a surface of the door body 21. The elastic member 37 may be a spring plate or other similar member with elasticity, the elastic member 37 is located between the longitudinal latching arm 35 (or the lateral latching arm 36) and an upper cover. The elastic member 37 has at least the following effects: first, when the longitudinal latching arm 35 and the lateral latching arm 36 are activated with the first driven cam 31 and the second driven cam 32, the elastic member 37 can ensure that the connecting ends of the longitudinal latching arm 35 and the lateral latching arm 36 are firmly located in the guide grooves, and will not be detached from the guide grooves caused by the actuation of the longitudinal latching arm 35, the lateral latching arm 36 and the first driven cam 31, the second driven cam 32. Second, when the longitudinal latching arm 35, the lateral latching arm 36 and the first driven cam 31, the second driven cam 32 are stationary, the elastic member 37 can force the longitudinal latching arm 35 and the lateral latching arm 36 to be positioned in the original place, thereby reducing damage, noises or particles caused by collisions and shakes between elements.

While the present invention has been described by means of specific embodiments, those skilled in the art should understand the above description is merely embodiments of the invention, and it should not be considered to limit the scope of the invention. It should be noted that all changes and substitutions which come within the meaning and range of equivalency of the embodiments are intended to be embraced in the scope of the invention. Therefore, the scope of the invention is defined by the claims.

What is claimed is:

1. A top-opening substrate carrier, comprising:
   a container body, having an accommodating space and an upper opening communicated to the accommodating space, the container body is provided with a plurality of locking holes;
   a door member, provided in the upper opening, the door member has a latching space; and
   at least one latching mechanism, provided in the latching space, the latching mechanism includes a rotary drive member, a first driven cam, a second driven cam, a first connecting rod, a second connecting rod, two longitudinal latching arms and two lateral latching arms, the first driven cam and the second driven cam are respectively disposed at two opposite sides of the rotary drive member, the first connecting rod is at least connected to the first driven cam and the rotary drive member, and the second connecting rod is at least connected to the second driven cam and the rotary drive member;
   wherein the rotary drive member is rotated by force, and links and activates the first connecting rod and the second connecting rod to synchronously drive the first driven cam and the second driven cam to rotate, thereby driving the two longitudinal latching arms and the two lateral latching arms to project towards the plurality of locking holes and locked, or driving the two longitudinal latching arms and the two lateral latching arms to retract from the plurality of locking holes and unlocked.

2. The top-opening substrate carrier according to claim 1, wherein the rotary drive member is a cam, the first connecting rod is connected to a first butting portion on the rotary drive member and the first driven cam, the second connecting rod is connected to a second butting portion on the rotary drive member and the second driven cam.

3. The top-opening substrate carrier according to claim 2, wherein the first connecting rod is further extended to the second driven cam, the second connecting rod is further extended to the first driven cam, the first connecting rod and the second connecting rod are parallel to each other.

4. The top-opening substrate carrier according to claim 1, wherein one end of one of the longitudinal latching arms and one end of one of the lateral latching arms are slidably connected to the first driven cam, and respectively activate to project or retract from the first driven cam toward the plurality of locking holes, one end of the other one of the longitudinal latching arms and one end of the other one of the lateral latching arms are slidably connected to the second driven cam, and respectively activate to project or retract from the second driven cam toward the plurality of locking holes.

5. The top-opening substrate carrier according to claim 1, wherein the rotary drive member is a linkage member, the first connecting rod and the second connecting rod are respectively connected to the first driven cam and the second driven cam, and the linkage member is connected to the first connecting rod and the second connecting rod.

6. The top-opening substrate carrier according to claim 1, wherein an extension direction of the longitudinal latching arm is perpendicular to an extension direction of the lateral latching arm.

7. The top-opening substrate carrier according to claim 1, wherein the number of the latching mechanism is two, the two latching mechanisms are mirror-symmetrically provided in the latching space with each other.

8. The top-opening substrate carrier according to claim 1, wherein the first driven cam and the second driven cam are respectively provided with two guide grooves, the two longitudinal latching arms and the two lateral latching arms are respectively slidably disposed in the guide groove with a guide post.

9. The top-opening substrate carrier according to claim 1, wherein the door member includes a door body and a door cover, the door cover covers the door body to define the latching space.

10. The top-opening substrate carrier according to claim 9, wherein the longitudinal latching arm and the lateral latching arm respectively further include at least one elastic member, and one end of the elastic member is abutted against a surface of the door body.

* * * * *